(12) United States Patent
Nakanishi et al.

(10) Patent No.: US 8,840,258 B2
(45) Date of Patent: Sep. 23, 2014

(54) ANTIREFLECTION STRUCTURE FORMATION METHOD AND ANTIREFLECTION STRUCTURE

(71) Applicants: Tsutomu Nakanishi, Tokyo (JP); Akira Fujimoto, Kawasaki (JP); Koji Asakawa, Kawasaki (JP); Takeshi Okino, Yokohama (JP); Shinobu Sugimura, Yokohama (JP)

(72) Inventors: Tsutomu Nakanishi, Tokyo (JP); Akira Fujimoto, Kawasaki (JP); Koji Asakawa, Kawasaki (JP); Takeshi Okino, Yokohama (JP); Shinobu Sugimura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/723,374

(22) Filed: Dec. 21, 2012

(65) Prior Publication Data

US 2013/0135746 A1 May 30, 2013

Related U.S. Application Data

(62) Division of application No. 12/347,187, filed on Dec. 31, 2008, now Pat. No. 8,361,339.

(30) Foreign Application Priority Data

Jan. 4, 2008 (JP) ................................. 2008-000059

(51) Int. Cl.
*G02B 27/00* (2006.01)
*C03C 15/00* (2006.01)
*C03C 17/00* (2006.01)
*G02B 1/11* (2006.01)

(52) U.S. Cl.
CPC .......... *G02B 1/118* (2013.01); *C03C 2218/355* (2013.01); *C03C 17/007* (2013.01); *C03C 2217/77* (2013.01); *C03C 2217/42* (2013.01); *C03C 15/00* (2013.01); *C03C 2218/34* (2013.01)
USPC ........................................... 359/601; 216/58

(58) Field of Classification Search
None
See application file for complete search history.

(56) References Cited

U.S. PATENT DOCUMENTS

2004/0163246 A1 8/2004 Nishioka et al.
(Continued)

FOREIGN PATENT DOCUMENTS

JP 2005-331868 12/2005
JP 2006-512781 4/2006
WO WO-2004/061980 A1 7/2004

OTHER PUBLICATIONS

Lalanne et al.: "Antireflection Behavior of Silicon Subwavelength Periodic Structures for Visible Light", Nanotechnology, vol. 8, pp. 53-56, (1997).

(Continued)

*Primary Examiner* — Shamim Ahmed
*Assistant Examiner* — Bradford Gates
(74) *Attorney, Agent, or Firm* — Finnegan, Henderson, Farabow, Garrett & Dunner, L.L.P.

(57) ABSTRACT

The present invention provides such a formation method that an antireflection structure having excellent antireflection functions can be formed in a large area and at small cost. Further, the present invention also provides an antireflection structure formed by that method. In the formation method, a base layer and particles placed thereon are subjected to an etching process. The particles on the base layer serve as an etching mask in the process, and hence they are more durable against etching than the base layer. The etching rate ratio of the base layer to the particles is more than 1 but not more than 5. The etching process is stopped before the particles disappear. It is also possible to produce an antireflection structure by nanoimprinting method employing a stamper. The stamper is formed by use of a master plate produced according to the above formation method.

25 Claims, 6 Drawing Sheets

(56) References Cited

U.S. PATENT DOCUMENTS

| | | |
|---|---|---|
| 2004/0247010 A1 | 12/2004 | Okada et al. |
| 2006/0192483 A1 | 8/2006 | Nakanishi et al. |
| 2007/0049047 A1 | 3/2007 | Fujimoto et al. |
| 2007/0085072 A1 | 4/2007 | Masumoto et al. |
| 2007/0145557 A1* | 6/2007 | Kamiyama et al. ........... 257/678 |
| 2007/0289874 A1 | 12/2007 | Masuda et al. |
| 2008/0057273 A1 | 3/2008 | Hamamura et al. |

OTHER PUBLICATIONS

Toyota et al.; "Fabrication of Microcone Array for Antireflection Structured Surface Using Metal Dotted Pattern"; Jpn. J. Appl. Phys., vol. 40, pp. L-747-L-749, (2001).

Toyota, "Antireflection Structured Surface," Japanese Journal of Optics (2003), 32:489-491, and English-language abstract.

Dai et al., "Nonocontact Printing Using a Hydrogen Silsesquioxane Stamp with Low E-beam Dose," J. of the Electrochemical Society, vol. 154, No. 7, H636-641, May 18, 2007.

* cited by examiner (a) (b)

ANTIREFLECTION STRUCTURE FORMATION METHOD AND ANTIREFLECTION STRUCTURE

CROSS-REFERENCE TO RELATED APPLICATION

This is a division of application Ser. No. 12/347,187, filed Dec. 31, 2008, which is incorporated herein by reference.

This application is based upon and claims the benefit of priority from the prior Japanese Patent Application No. 59/2008, filed on Jan. 4, 2008; the entire contents of which are incorporated herein by reference.

BACKGROUND OF THE INVENTION

1. Field of the Invention

The present invention relates to an antireflection structure formation method and an antireflection structure.

2. Background Art

According as ultrafine micro-fabrication technologies used in LSI production processes and micro-machining processes have been developed recently, it has become possible to produce sub-wavelength gratings, which have periods shorter than the wavelength of light and which can be processed in nanometer scale. For example, as one of the sub-wavelength gratings, there is proposed a non-reflective periodic structure (see, Hiroshi Toyota, Kogaku (Japanese Journal of Optics [in Japanese]), Optical society of Japan, vol. 32 (2003), pp. 489). The non-reflective periodic structure has a surface provided with numerous small projections by which Fresnel reflection on the light-incident surface is reduced to ensure aimed antireflection properties. The Fresnel reflection is generally determined by inherent refractive index of substance. However, in the non-reflective periodic structure, the refractive index is artificially set up with the surface structure formed more finely than the wavelength of incident light and is also made to vary continuously from the light-incident side to the substrate side, and thereby the aimed antireflection properties can be realized. This antireflection structure can reduce reflectance in a wide wavelength range and in a wide incident angle range, and accordingly is effectively used for optical elements or devices, such as lenses and displays, in which light reflection often becomes a large problem.

In order to obtain the above antireflection effect, the intervals among the projections must be several hundred nanometers or less and hence the fabrication in nanometer scale is required. In view of this, it is proposed to fabricate an antireflection structure by electron beam lithography or by laser beam interference exposure method (see, P. Lalanne, et. al., Nanotechnology, 8, 52(1997)). However, although fine patterns can be formed very precisely, these fabrication technologies are not suitable for industrial applications because they need expensive apparatuses and give low throughput.

It is also proposed to form nano-size projections not by the conventional lithographic technologies but by an etching process in which particles are used as an etching mask (JP-A 2006-512781(KOKAI)). According to this etching process, columnar structures having sizes corresponding to diameters of the particles can be formed on a substrate. However, in the process, the selective etching ratio between the particles and the substrate is too large to form projections having high antireflection functions. It is also proposed to form projections by another etching process in which particles having a high selective etching ratio to the substrate is used as the mask. In the process, first the substrate is processed and then the particles are slimed while the etching gas is successively changed (JP-A 2005-331868 (KOKAI)). However, although projections can be almost obtained, this etching process comprises complicated procedures since the etching gas must be successively changed. Further, bumps are formed in the projections whenever the etching gas is changed, so that the refractive index varies not smoothly and, as a result, that the antireflection functions are impaired. Furthermore, since all the particles serving as the mask are completely etched, the tips of the projections are so sharpened by side-etching that the refractive index changes steeply at the tips to lower the antireflection functions. This unfavorable effect is enhanced if the particles have more uneven sizes, and consequently the projections are liable to have such uneven shapes that the antireflection functions are deteriorated and/or that the process margin is often narrowed to lower the productivity.

SUMMARY OF THE INVENTION

First, the present invention resides in a method for forming an antireflection structure in which plural projections are arranged on a substrate, comprising the steps of:

forming a base layer on a substrate, forming a particle-trap layer on said base layer, forming, on said particle-trap layer, a multi-particle layer in which particles having a mean particle size of 20 to 1000 nm are arranged in one or more layers, sinking the particles positioned at the bottom of said multi-particle layer into the particle-trap layer, removing the particles in said multi-particle layer except the particles positioned at the bottom, removing said particle-trap layer with holding the particles positioned at the bottom on the base layer, and performing an etching process in which said base layer is subjected to reactive ion etching while the particles remaining on said base layer are used as a mask to form projections, under the conditions that the etching rate ratio of said base layer to said particles is more than 1 but not more than 5 and that the process is stopped before the particles disappear by etching.

Secondly, the present invention also resides in a method for forming an antireflection structure in which plural projections are arranged, comprising the steps of:

forming a base layer on a substrate, forming a particle-trap layer on said base layer, forming, on said particle-trap layer, a multi-particle layer in which particles having a mean particle size of 20 to 1000 nm are arranged in one or more layers, sinking the particles positioned at the bottom of said multi-particle layer into the particle-trap layer, removing the particles in said multi-particle layer except the particles positioned at the bottom, removing said particle-trap layer with holding the particles positioned at the bottom on the base layer, performing an etching process in which said base layer is subjected to reactive ion etching while the particles remaining on said base layer are used as a mask to form projections, under the conditions that the etching rate ratio of said base layer to said particles is more than 1 but not more than 5 and that the process is stopped before the particles disappear by etching, so as to produce a master plate in which the plural projections are arranged on the substrate, using said master plate to produce a nanoimprint stamper having a pattern reverse to the pattern formed on the master plate, and performing a nanoimprinting process in which said nanoimprint stamper is used to produce a replica of the pattern on the master plate.

The present invention further resides in an antireflection structure formed by either of the above methods.

The present invention furthermore resides in a nanoimprint stamper for forming an antireflection structure, produced by the steps of:
  forming a base layer on a substrate,
  forming a particle-trap layer on said base layer,
  forming, on said particle-trap layer, a multi-particle layer in which particles having a mean particle size of 20 to 1000 nm are arranged in one or more layers,
  sinking the particles positioned at the bottom of said multi-particle layer into the particle-trap layer,
  removing the particles in said multi-particle layer except the particles positioned at the bottom,
  removing said particle-trap layer with holding the particles positioned at the bottom on the base layer,
  performing an etching process in which said base layer is subjected to reactive ion etching while the particles remaining on said base layer are used as a mask to form projections, under the conditions that the etching rate ratio of said base layer to said particles is more than 1 but not more than 5 and that the process is stopped before the particles disappear by etching, so as to produce a master plate in which the plural projections are arranged on the substrate, and
  using said master plate to produce a nanoimprint stamper having a pattern reverse to the pattern formed on the master plate.

The present invention furthermore resides in a method for forming an antireflection structure in which plural projections are arranged, comprising the steps of:
  forming a base layer on a substrate,
  forming a particle-trap layer on said base layer,
  forming, on said particle-trap layer, a multi-particle layer in which particles having a mean particle size of 20 to 1000 nm are arranged in one or more layers,
  sinking the particles positioned at the bottom of said multi-particle layer into the particle-trap layer,
  removing the particles in said multi-particle layer except the particles positioned at the bottom,
  removing said particle-trap layer with holding the particles positioned at the bottom on the base layer,
  performing an etching process in which said base layer is subjected to reactive ion etching while the particles remaining on said base layer are used as a mask to form projections, under the conditions that the etching rate ratio of said base layer to said particles is more than 1 but not more than 5 and that the process is stopped before the particles disappear by etching, so as to produce a master plate in which the plural projections are arranged on the substrate,
  using said master plate to produce a replica having a pattern reverse to the pattern formed on the master plate,
  using said replica to produce a nanoimprint stamper having a pattern reverse to the pattern formed on the replica, and
  performing a nanoimprinting process in which said nanoimprint stamper is used to produce a replica of the pattern on the master plate.

The present invention furthermore resides in a nanoimprint stamper for forming an antireflection structure, produced by the steps of:
  forming a base layer on a substrate,
  forming a particle-trap layer on said base layer,
  forming, on said particle-trap layer, a multi-particle layer in which particles having a mean particle size of 20 to 1000 nm are arranged in one or more layers,
  sinking the particles positioned at the bottom of said multi-particle layer into the particle-trap layer,
  removing the particles in said multi-particle layer except the particles positioned at the bottom,
  removing said particle-trap layer with holding the particles positioned at the bottom on the base layer,
  performing an etching process in which said base layer is subjected to reactive ion etching while the particles remaining on said base layer are used as a mask to form projections, under the conditions that the etching rate ratio of said base layer to said particles is more than 1 but not more than 5 and that the process is stopped before the particles disappear by etching, so as to produce a master plate in which the plural projections are arranged on the substrate,
  using said master plate to produce a replica having a pattern reverse to the pattern formed on the master plate, and
  using said replica to produce a nanoimprint stamper having a pattern reverse to the pattern formed on the replica The present invention in one embodiment provides a formation method by which an antireflection structure excellent in antireflection functions can be produced in a large area at small cost. Further, the present invention in another embodiment provides an antireflection structure excellent in antireflection functions.

DETAILED DESCRIPTION OF THE INVENTION

Embodiments of the present invention are described below with the attached drawings referred to.

Figure 1:
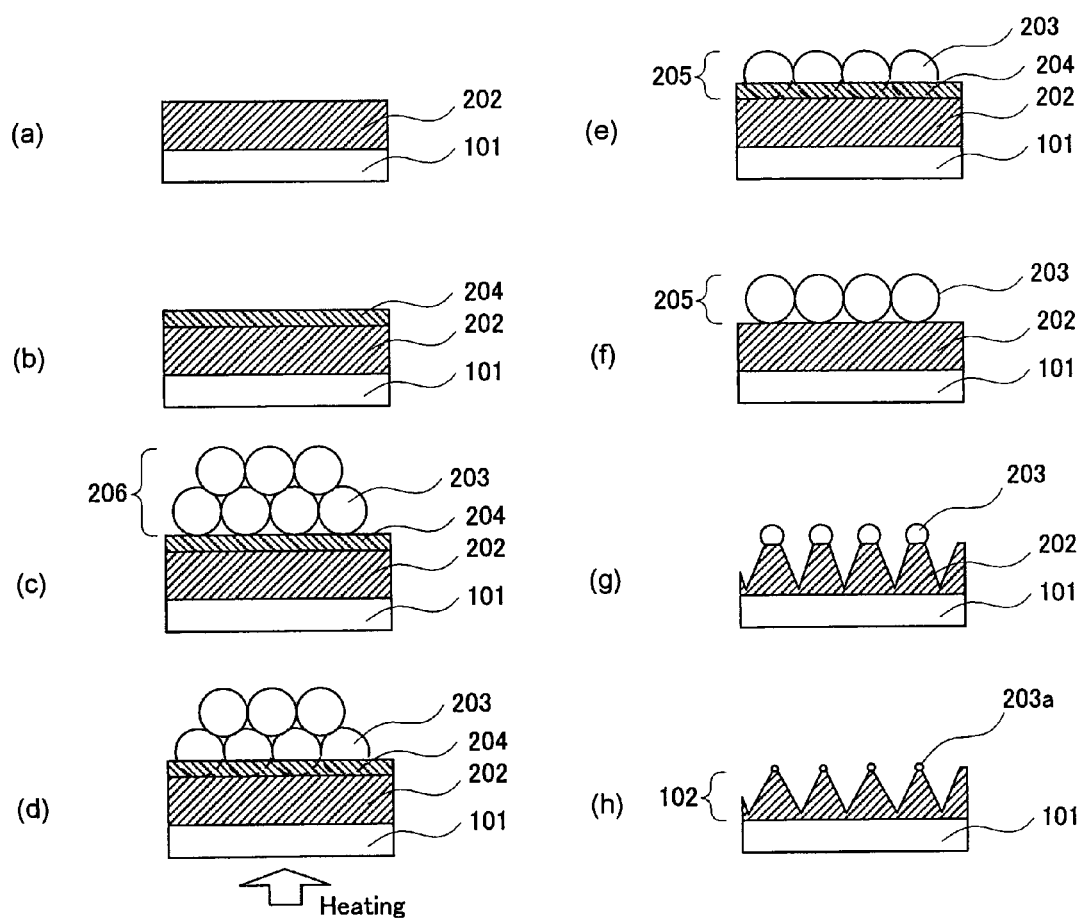
FIG. 1 shows sectional views schematically illustrating a method for forming an antireflection structure according to one embodiment of the present invention.

FIG. 1 shows sectional views schematically illustrating a method for forming an antireflection structure according to one embodiment of the present invention. Needless to say, FIG. 1 illustrates only a typical example for promoting understanding of the embodiment, and therefore it by no means restricts the antireflection structure formation method of the present invention.

On a substrate 101, a base layer 202 for forming an antireflection structure is provided (FIG. 1(a)). There is no particular restriction on the material of the substrate, and hence any of inorganic materials, organic materials and organic and inorganic composite materials can be used. There is also no particular restriction on the size and thickness of the substrate, and further the substrate may have any surface such as a flat surface or a curved surface. Examples of the substrate include a glass substrate, a quartz substrate and a Si substrate. In consideration of adhesion between the substrate and the base layer, the substrate may be subjected to surface treatment before the base layer is formed thereon. Further, also before the base layer is formed, a material having high durability against etching described later can be accumulated on the substrate to form a stopper layer.

The base layer is made of such a material that the selective etching ratio thereof to the particles is in the range of more than 1 but not more than 5, preferably in the range of more than 1 but not more than 2.5 under the below-described etching conditions. There is no particular restriction on the material of the base layer as long as the selective etching ratio thereof is in the above range, and hence any of inorganic materials, organic materials and organic and inorganic composite materials can be used. When the base layer is processed by etching, the particles serving as an etching mask are gradually slimed according as the etching time elapses since the selective etching ratio of the base layer to the particles is more than 1 but not more than 5. Thus, projections are formed on the substrate. If the selective etching ratio is too small, the particles cannot fully serve as a mask and hence the projections formed from the base layer by etching have too low an aspect ratio, for example, an aspect ratio of 1 or less, to obtain high antireflection effect. On the other hand, if the selective etching ratio is too large, the particles have such high durability against etching that tips of the projections in the pattern are difficult to be properly sharpened. In that case, if the etching time is prolonged to sharpen the tips, the projections undergo side etching to impair the antireflection effect. Accordingly, it is unfavorable. If the particles are made of silica materials, the base layer can be made of, for example, silica materials, silicone materials or silsesquioxane materials since the selective etching ratios of these materials to the particles are within the above range under the etching conditions for processing the base layer. Among the above materials, silsesquioxane materials are preferred. In the case where silsesquioxane materials are used, the projections after formed are preferably subjected to heat treatment at a temperature of 400° C. to 1000° C. If the particles are mainly made of polystyrene resin, the base layer can be made of, for example, acrylic resin, phenol resin, polystyrene resin or polyimide resin. There is no particular restriction on the method for forming the base layer, and hence thin-film formation methods generally known can be used. Examples of the thin-film formation methods include wet processes such as spin-coating method, dip-coating method and squeegee method and dry processes such as vacuum-deposition method, sputtering method and CVD method. There is also no particular restriction on the thickness of the base layer 202 as long as the thickness is larger than the height of the aimed antireflection structure, but it is normally 20 to 2500 nm, preferably 50 to 1000 nm.

Thereafter, a particle-trap layer 204 is formed on the base layer 202 (FIG. 1(b)). The particle-trap layer combines the base layer with fine particles, which serve as an etching mask when the base layer is processed by etching. If the particles are arranged in a mono-layer by conventional method such as spin-coating method without using the particle-trap layer, they isometrically interact with each other through intermolecular force and consequently are so unevenly dispersed that there are formed some areas where the particles are gathered densely and other areas where the particles are scarcely present. These areas cause defects of the resultant antireflection structure, and hence impair the antireflection functions.

The particle-trap layer is generally made of a material comprising a polymer compound and satisfying the following four conditions.

(1) The material can become fluid at least once when heated.
(2) The material has a glass transition point lower than any of the glass transition point, the melting point and the sintering temperature of the particles.
(3) The material is not damaged by a particle-dispersion solution or by a washing solution. For example, the material is not dissolved or does not come off, and further the surface thereof is not roughened.
(4) The selective etching ratio of the material to the base layer and the particles is more than 1 under the conditions where the particle-trap layer is removed by etching.

As the polymer compound, either an organic polymer compound or an inorganic polymer compound can be used. There is no particular restriction on the molecular weight of the polymer compound. The material of the particle-trap layer may be a composition containing additives such as a plasticizer, if necessary. For example, an organic thermo-plastic polymer compound mixed with desired additives is generally used as the composition, and it is also possible to use a B-staged thermo-setting resin. Further, in the case where the antireflection structure is required to be formed in a particular area such as a patterned area on the substrate, a patterned particle-trap layer can be photo-lithographically formed from a resin composition containing photosensitive substance. There is no particular restriction on the method for forming the particle-trap layer, and hence any method can be used. Normally, the particle-trap layer is formed by coating the substrate with a solution or suspension containing materials of the particle-trap layer. There is no particular restriction on the coating method, and hence any of known coating methods such as spin-coating method, dip-coating method and squeegee method can be used. Among them, the spin-coating method is preferred since it can control nano-scale thickness to form a thin membrane. In the case where the particle-trap layer is to be formed on a large substrate, the dip-coating method is also preferred.

The thickness of the particle-trap layer is preferably approx. ⅓ of the mean particle size of the particles. As described later, the particles 203 placed on the particle-trap layer are sunk in the particle-trap layer. Thereafter, the excess particles not sunk in the particle-trap layer 204 are removed by washing. In this step, since the particles sunk in the particle-trap layer are kept in contact with the particle-trap layer in large areas to have sufficient adhesion, they can escape from removing to remain. Accordingly, in the case where it is necessary to wash away the excess particles, the particles to remain are preferably sunk in the particle-trap layer to a certain depth. The thickness of the particle-trap layer, therefore, depends upon the diameters of the particles, but is generally 6 to 350 nm, preferably 20 to 120 nm.

On the particle-trap layer, particles 203 are arranged to form a multi-particle layer 206 (FIG. 1(c)). As described above, the material of the particles must have a selective etching ratio to the base layer in a particular range under the etching conditions for processing the base layer. The particles have a mean particle size of 20 to 1000 nm, preferably 50 to 350 nm. If the mean particle size is 20 nm or less, projections having sufficient height such as 100 nm or more cannot be formed and accordingly the antireflection effect on visible light, particularly, in the near infrared region is lowered. Accordingly, it is unfavorable. On the other hand, if the mean particle size is 1000 nm or more, the intervals among the formed projections are 1000 nm or more and accordingly light in the visible region is diffracted to impair the antireflection functions. It is hence unfavorable, too. In the present invention, the mean particle size can be determined on the basis of projected cross-section areas of the particles observed by scanning electron microscopy, and it corresponds to an average diameter of the particles on the assumption that they are spherical.

The particles are preferably in the shape of almost perfect sphere. This is because the particles in the shape of almost perfect sphere can be densely arranged when aggregated and, as a result, projections can be densely formed. The CV (coefficient of variant) value of the particle sizes is preferably 15% or less, more preferably 10% or less. If the CV value is more than 15%, it is difficult to arrange the particles densely because the particles have very different sizes. As a result, in that case, the density of the projections is lowered and the formed projections have very different shapes, and accordingly the antireflection effect is often impaired.

The multi-particle layer can be easily formed by coating a particle-dispersion solution on the particle-trap layer and then by evaporating the dispersion medium. There is no particular restriction on the method for coating the particle-dispersion solution, and hence any of known coating methods such as spin-coating method, dip-coating method and squeegee method can be used. The dispersion medium is evaporated to dry preferably at a temperature lower than the glass transition point of the polymer compound used in the particle-trap layer. There is no particular restriction on the drying method. For example, if the spin-coating method is employed, the sample may be kept rotating until dried or otherwise may be rotated for a few seconds to spread the dispersion medium and then dried naturally, by heating or by blowing of nitrogen gas. Also in the case where the dip-coating method or the squeegee method is employed, the sample can be dried naturally, by heating or by blowing of nitrogen gas. If the coating procedure or the drying procedure is performed at a temperature not lower than the glass transition point of the particle-trap layer, the material of the particle-trap layer often partly dissolves into the particle-dispersion solution and consequently remains among the particles after the dispersion medium is dried. It should be noted that the material thus remaining is liable to prevent the particles from being removed by washing.

While the particle-dispersion solution spread on the trap layer is being dried, the particles are gradually gathered densely by the actions of the surface tension of the dispersion solution and of the intermolecular force among the particles. As a result, a multi-particle layer in which the particles are densely arranged is formed. In the case where the above procedures are carried out at a temperature lower than the glass transition point, the multi-particle layer is not sufficiently fixed on the particle-trap layer.

In order to improve wettability of the particle-dispersion solution when coated on the particle-trap layer, surfactants may be added into the dispersion solution and/or the trap layer may be beforehand subjected to surface treatment. For example, in the case where the dispersion medium is water and the tap layer is made of hydrophobic resin, the dispersion medium is often so repelled that the multi-particle layer cannot be evenly formed because they are very different in surface energy. However, if the surface of the trap layer is made to be hydrophilic by known treatment such as UV washing or oxygen plasma treatment, the multi-particle layer can be evenly formed on the whole surface of the substrate.

After the multi-particle layer 206 is formed, the substrate is heated to a temperature not lower than the glass transition point of the particle-trap layer 204 so that the particles 203 can be sunk in the particle-trap layer 204 (FIG. 1(d)). There is no particular restriction on the method for heating, and hence known methods are usable. For example, the substrate may be heated on a hot-plate or in a heating furnace. It is also possible to heat only a part of the substrate by laser exposure. As shown in FIG. 1(d), the sample is preferably heated from the side opposite to the multi-particle layer, namely, from the substrate side. If the sample is heated from the particle layer side, the particle-trap layer is often so unevenly heated that the particles are sunk unevenly to form defects in the case where the particles in the multi-particle layer are unevenly layered, in other words, where the multi-particle layer has uneven thickness.

When heated, the particle-trap layer becomes fluid and rises to soak into voids of the multi-particle layer. How high the trap layer rises is determined by the original volume of the trap layer and by the volume of the voids among the particles. The multi-particle layer is thus sunk and fixed in the trap layer to the depth depending upon the thickness of the trap layer. In many cases, the heating time for sinking the particles 203 in the trap layer 204 is approx. 1 minute. During this procedure, the multi-particle layer may be pressed downward so that the particles can be easily sunk. Further, after the particles are sunk in the trap layer, the trap layer may be heated above the curing temperature to harden thermally or otherwise the trap layer beforehand incorporated with a photo-polymerization initiator may be exposed to UV light to harden photo-chemically so as to increase adhesion between the particles and the trap layer.

Thereafter, the substrate is washed with a washing solution and thereby the particles in the multi-particle layer 206 except those sunk in the trap layer are removed to form a mono-particle layer 205 (FIG. 1(e)). The substrate is preferably washed at a temperature lower than the glass transition point of the particle-trap layer. If it is not lower, the trap layer is so softened that the particles caught in the trap layer may come off or that the particles washed off may reattach. There is no particular restriction on the washing solution, and hence water, various organic solvents and mixtures thereof can be used. Examples of the organic solvents include alcohols such as methyl alcohol, ethyl alcohol and isopropyl alcohol. The washing solution may contain additives such as surfactants.

The substrate on which the mono-particle layer is thus attached is then subjected to dry etching to remove the particle-trap layer (FIG. 1(f)). The etching procedure is performed under the condition that the selective etching ratios of the base layer and the particles to the particle-trap layer are less than 1, preferably less than 0.5, and thereby only the particle-trap layer can be selectively removed while the base layer and the particles are scarcely etched. In this step, the mono-particle layer, namely the particles positioned at the bottom is held. The etching gas is preferably selected to be effective in etching the trap layer, and hence is, for example, oxygen gas in the case where the trap layer is made of an organic polymer mainly comprising carbon atoms. On the other hand, if the trap layer is made of a silicon atom-containing material such as silicone resin, an etching gas mainly comprising fluorine-type gas can be used.

Figure 2:
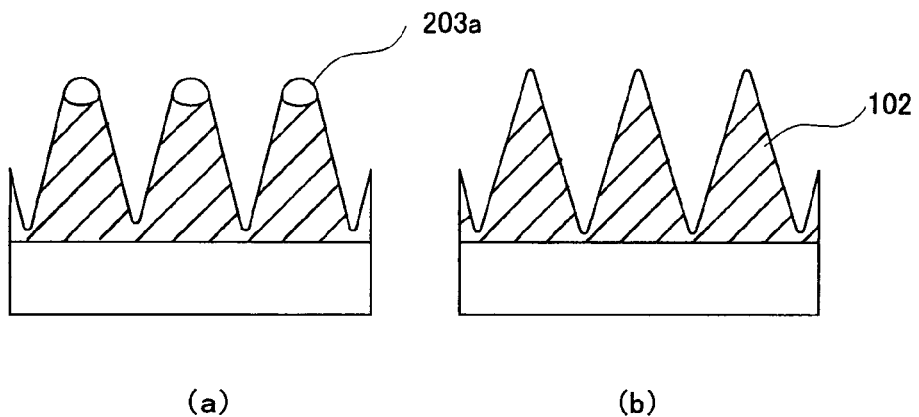
FIG. 2 shows sectional views schematically illustrating antireflection structures according to the present invention and the prior art.
Figure 7:
FIG. 7 is an electron micrograph image showing a surface of an antireflection structure according to one embodiment of the present invention.

Finally, the substrate on which the mono-particle layer is thus formed is then subjected to dry etching to form a pattern of projections (FIGS. 1(g) and (h)). The etching procedure is performed under the condition that the selective etching ratio of the base layer to the particles is within the aforementioned range, and thereby the particles are gradually etched to reduce the particle sizes according as the base layer 202 proceeds to be etched. As a result, the base layer is etched to form a pattern of projections 102 having high aspect ratios, such as aspect ratios of 1 to 5. The etching process is stopped so that the particles 203a having smaller diameters than those before etched can be left on the tips of the projections, to obtain an antireflection structure having high antireflection functions. Since the particles are left on the tips, the projections of the pattern have round tips as shown in FIG. 2(a). By way of example, the shapes of the projections are shown in FIG. 7. If the etching process is continued until the particles on the tips disappear, the resultant projections have sharp tips as shown in FIG. 2(b).

Figure 3:
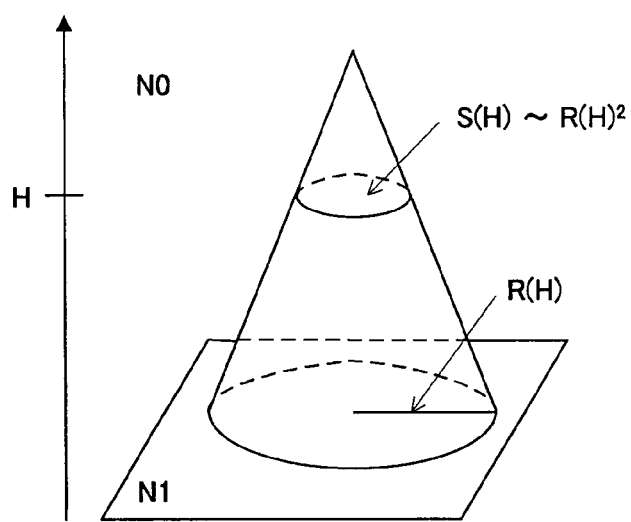
FIG. 3 shows a scheme illustrating various parameters of the antireflection structure.
Figure 4:
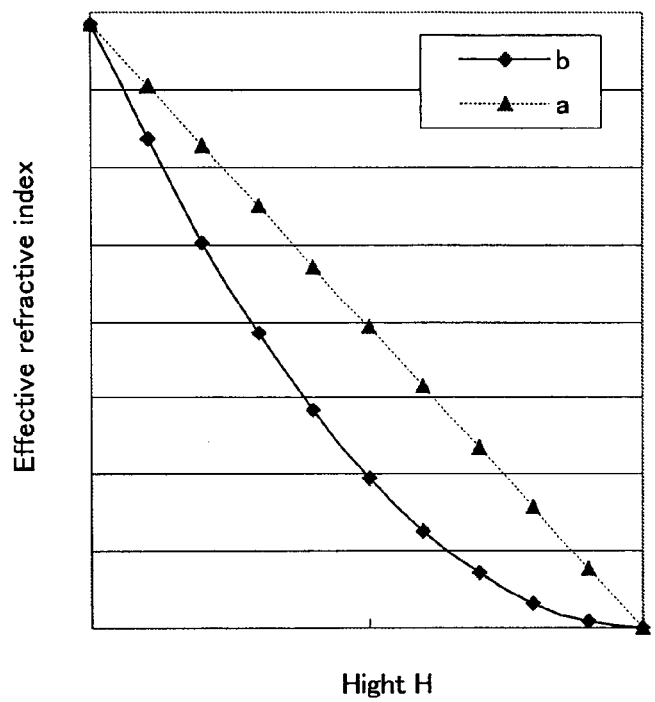
FIG. 4 shows graphs illustrating relations between the effective refractive index and the height of projections.

The particles having a small mean particle size are thus left on the tips, and they give the effect explained below with the attached drawings referred to. FIG. 3 schematically illustrates a projection formed on the base having a refractive index N1. In the figure, N0 stands for the external refractive index. The refractive index of the projection at the height H depends upon an area ratio of its cross section parallel to the substrate surface. This is represented by the formula (1):

$$Neff = N0 \cdot (1-S1) + N1 \cdot S1 \qquad (1)$$

in which Neff is the refractive index and S1 is the area ratio at the height H. Since the projection has a conical shape, the area ratio S1 and the radius R(H) of the cross section at the height H satisfy the relation represented by the formula (2):

$$S1 = k \cdot (R(H))^2 \qquad (2)$$

in which k is a proportionality constant. Here, a projection-shape function A(H) is defined by the outline curve of its vertical section perpendicular to the substrate. In the case where the tips are sharpened, the projection-shape function A(H) is in proportion to the height H and hence expressed by the formula (3):

$$A(H) = C \cdot H \qquad (3)$$

in which C is a constant corresponding to the inclination of the projection outline. The refractive index of the projection at the height H is calculated from the formulas (1) to (3) to obtain a straight line such as a straight line (a) in FIG. 4. On the other hand, in the case where the tips are rounded as those in the present invention, the projection-shape function A(H) can be fitted into a quadratic function and hence expressed by the formula (4):

$$A(H) = C \cdot H^2 \qquad (4)$$

in which C is a constant. The refractive index of the projection at the height H is calculated from the formulas (1), (2) and (4), to obtain a curve such as a curved line (b) in FIG. 4. In comparison between the lines (a) and (b) in FIG. 4, it is clear that the refractive index of the projection formed in the present invention varies smoothly from the substrate side to the outside and that there is no range where the refractive index varies steeply. On the other hand, it is also clear that, if the etching process is continued not to leave the particles 203a and thereby to sharpen the tips of the projections, there is a range where the refractive index varies steeply. Accordingly, the projections of the present invention, in which the refractive index varies smoothly, give high antireflection effect.

The shapes of the particles left on the tips of the projections depend upon size distribution of the particles serving as the etching mask. Since each particle reduces the same volume by etching, particles having small diameters before etching disappear rapidly. Accordingly, the size distribution of the particles serving as the etching mask is controlled so as to obtain an optimal antireflection structure. The present inventors have studied and found that, if the remaining particles 203a have a relative volume of 25% or less based on the volume of the particles 203 before the etching process, the formed projection has a quadratic outline and hence the refractive index varies favorably. Therefore, in order that the refractive index may vary favorably, the remaining particles have a relative volume of preferably more than 0% but not more than 25%, further preferably 5 to 15%, based on the volume of those before the etching process. The etching process is preferably so performed that 80% or more number of particles arranged in the mono-particle layer 205 on the substrate may reduce the volume into 25% or less based on the volume of the particles 203 before the etching process, and thereby 70% or more, 80% or more, or 90% or more number of the particles are preferably left under the condition that the CV value is in the range of 15% or more, in the range of 5 to 15%, or in the range of less than 5%, respectively. Thus, high antireflection effect can be obtained in the present invention. Here, the "CV value" is calculated as the standard deviation of the particle sizes divided by the mean particle size, and is widely used as a value indicating the particle size distribution.

Further, if the etching process of the base layer is continued until all the particles completely disappear, evenness of the pattern is impaired. Since small particles disappear rapidly, the areas masked with the small particles are bared early and hence are over-etched to cause pattern collapse if the etching process is continued until large particles also disappear. As a result, the antireflection effect is seriously impaired. The etching process, therefore, is stopped before the particles disappear, and thereby the process margin can be widened.

It can be confirmed by observation with scanning electron microscopy whether the particles are left on the tips of the projections. The projections formed from the base layer and the particles left on the tips thereof can be clearly distinguished if the section of the formed antireflection structure is observed. In order that the etching process can be stopped before the particles disappear, the etching time is variously changed and the section is observed to obtain a calibration curve by which it can be determined when the particles disappear and hence when the etching process should be stopped.

In the antireflection structure obtained by the method of the present invention, the projections are generally arranged with imperfect periodicity. The structure often comprises plural domains adjoining randomly, and each domain has a size of a few micrometers to a few millimeters and comprises the projections regularly arranged in a triangle grating or in a square grating. If incident light comes at a deep angle into the projections arranged with perfect periodicity, the light is diffracted to cause troubles in some applications such as displays. In contrast, the structure of the present invention can avoid the diffraction of light without impairing the antireflection functions.

Figure 5:
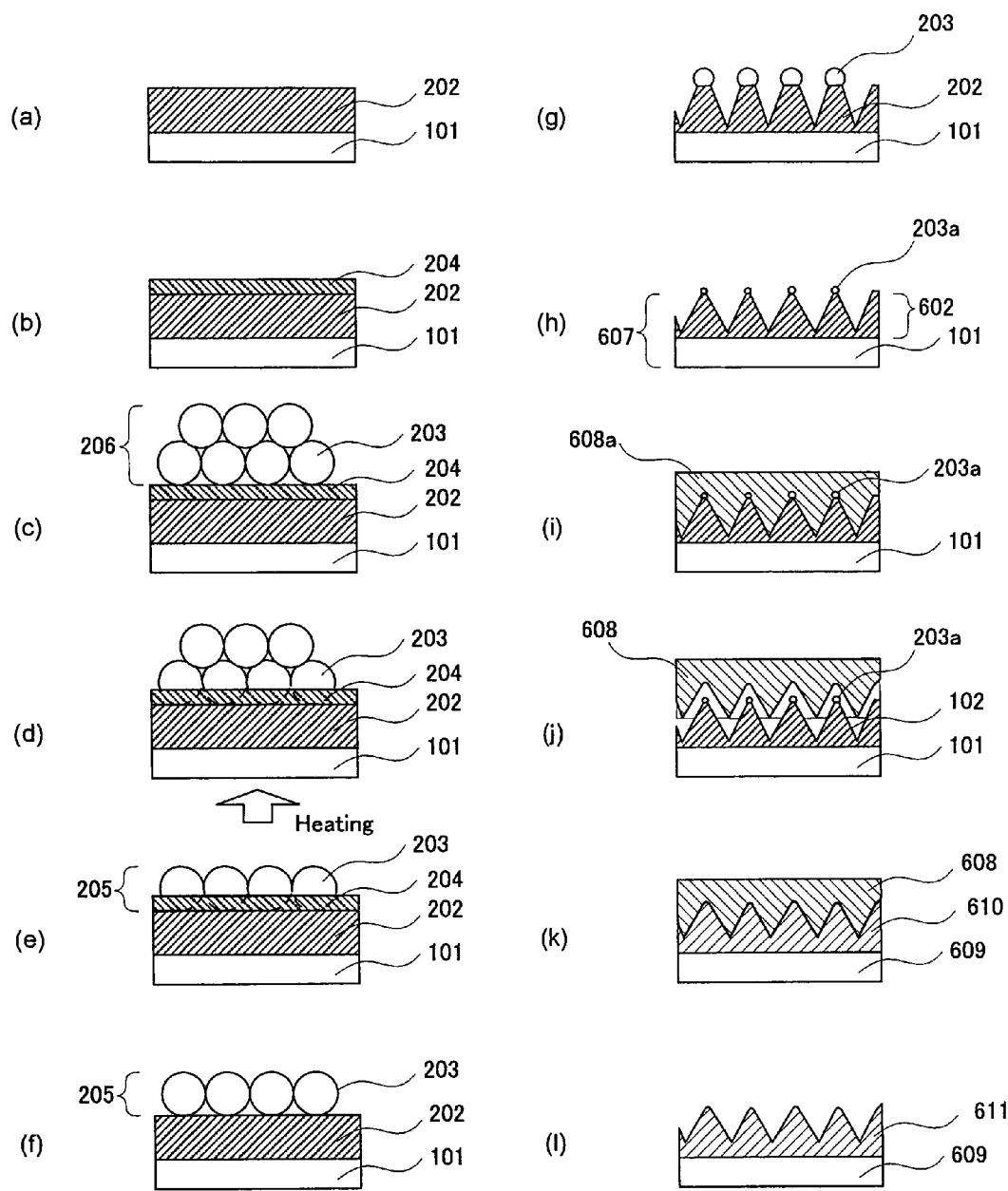
FIG. 5 shows sectional views schematically illustrating another method for forming an antireflection structure according to another embodiment of the present invention.

In the following description, the antireflection structure formation method according to another embodiment of the present invention is explained with FIG. 5 referred to. Needless to say, FIG. 5 illustrates only a typical example for promoting understanding of the embodiment, and therefore it by no means restricts the method of the present invention.

The steps shown in FIGS. 5(a) to 5(h) can be carried out in the same manner as described above, to form projections. The substrate 101 on which the projections 602 are thus formed is used not as the antireflection structure in itself but as a master plate 607 for forming the antireflection structure (FIG. 5(h)). By use of the master plate 607, a nanoimprint stamper 608 having a reverse pattern is produced. The nanoimprint stamper can be formed by any of the known methods such as an electrodeposition process. For example, the nanoimprint stamper can be produced by an electrodeposition process in the following manner. First, a thin electro-conductive membrane made of a metal such as Ni (not shown) is formed on the master plate, and then the plate is subjected to an electrochemical reaction in an electrodeposition bath to form an electrodeposition membrane 608a having a thickness of dozens of micrometers to several millimeters (FIG. 5(i)). After the master plate is taken out of the electrodeposition bath, the electrodeposition membrane is peeled off to obtain a nanoimprint stamper 608 (FIG. 5(j)). When the nanoimprint stamper is peeled from the master plate, the projection pattern 607 on the plate is often partly released together and attached on the stamper. In that case, the surface of the stamper is washed with a washing solution or cleaned by dry processes such as etching to obtain a clean surface. Further, the back surface of the stamper may be polished to be flat so that pressure can be evenly applied in the nanoimprinting process performed later.

Figure 6:
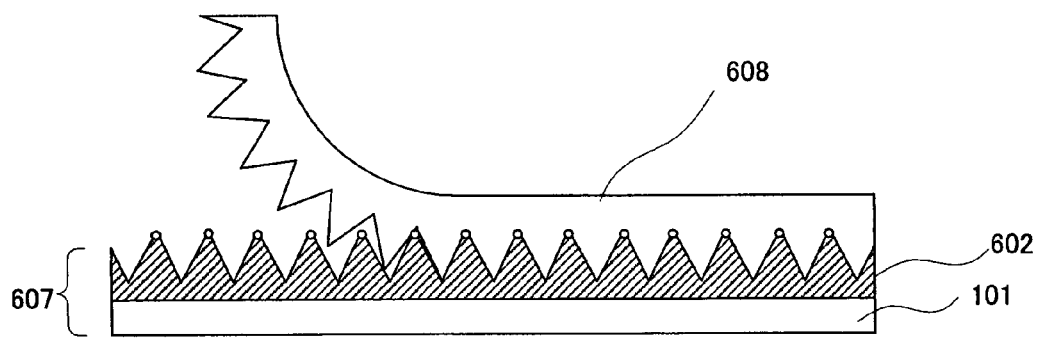
FIG. 6 shows a sectional view schematically illustrating a method for forming a stamper according to still another embodiment of the present invention.

When peeled off, the stamper may be wound up in a roll by means of a drum or a belt-type support, as shown in FIG. 6, to form a stamper roll. The stamper roll is preferably used in a roll imprinting process or in a roll-to-roll imprinting process, and hence is particularly advantageous in the case where the antireflection structure is formed by nanoimprinting in a large area such as a display substrate or a guide plate of LCD or in the case where high throughput is required, for example, in producing an antireflection film. Needless to say, the stamper may be released from the master plate and thereafter attached onto a drum or a belt-type support. The nanoimprint stamper formed by electrodeposition generally keeps sufficient strength even in a high-pressure imprinting process, and hence is particularly suitable for an imprinting process at room temperature or at an elevated temperature. The pattern of the master plate can be transferred onto thermosetting resin or photo-curable resin, to prepare a nanoimprint stamper having a pattern reverse to the pattern of the master plate. If the master plate is directly used as a stamper to perform imprinting, mechanical strength of the master plate may be enhanced to reduce damages suffered by the master pattern in the imprinting process. For example, a silsesquioxane material is used as the material of the base layer, from which the antireflection structure is formed. The formed antireflection structure is then subjected to high-temperature heat treatment in the range of 400° C. to 1000° C., and thereby the silsesquioxane material is converted into $SiO_x$. As a result, the master plate has higher strength than before the heat treatment, so as to reduce damages suffered by the master plate in the imprinting process.

Thereafter, by use of the nanoimprint stamper 608, a second base layer 610 formed on a second substrate 609 is subjected to nanoimprinting to produce a replica 611 having almost the same pattern as the master pattern. In order that the replica can be easily peeled from the stamper after nanoimprinting, the stamper and/or the base layer may be beforehand coated with a releasing agent comprising substances having low surface energies, for example, fluorine-containing compounds. The second substrate and the second base layer may be made of the same material. This means that the second substrate serving as a support may be omitted if the second base layer has sufficient strength. There is no particular restriction on the material of the second substrate as long as it has enough strength not to be destroyed in the imprinting process. Accordingly, any of inorganic materials, organic materials and organic and inorganic composite materials can be used. There is also no particular restriction on the size and thickness thereof. However, the substrate preferably has a flat surface so that pressure can be evenly applied in the imprinting process. Examples of the second substrate include a Si substrate, a quartz substrate, a glass substrate and a plastic substrate of resins such as PET resin and polycarbonate resin. Further, in consideration of adhesion between the second substrate and the second base layer provided thereon, the second substrate may be subjected to proper surface treatment.

There is no particular restriction on the material of the second base layer 610 as long as a pattern reverse to the pattern of the stamper can be transferred by nonoimprinting. For some applications, such as optical films, required to have high transparency in the visible region, materials having little absorbance in the visible region are preferably used.

In the case where a thermal imprinting process is performed, the second substrate before pressed is preferably heated at a temperature not lower than the glass transition point of the second base layer so that the second base layer becomes fluid. Examples of the material for the second base layer in the thermal imprinting process include thermoplastic or thermosetting resins such as acrylic resins, polystyrene resins, polyimide resins, polyester resins, epoxy resins, polycarbonate resins, melanin resins, cellulose resins, silicone resins, and mixtures thereof. Further, additives such as plasticizers and releasing agents can be incorporated.

In the case where a photo-imprinting process is performed, the second base layer during or after imprinting is irradiated with radiations such as visible light, UV light and electron beams to cause polymerization reaction and thereby to form the replica. Examples of the material for the second base layer in the photo-imprinting process include acrylic resins, polyester resins, epoxy resins, polystyrene resins, polyurethane resins, phenol resins, cellulose resins, silicone resins and silsesquioxane materials, provided that they contain photo-polymerizable functional groups. Further, it is also possible to use a resin composition comprising a binder of the above resins having no photo-polymerizable functional group, a monomer or oligomer having photo-polymerizable functional groups, and additives such as a photo-polymerizaton initiator, a polymerizaton inhibitor and a diluent. The resin composition may further contain a releasing agent so that the stamper after imprinting can be easily peeled off. There is no particular restriction on the method for forming the second base layer, and hence thin-film formation methods generally known can be used. Examples of the thin-film formation methods include wet processes such as spin-coating method, dip-coating method and squeegee method and dry processes such as vacuum-deposition method, sputtering method and CVD method. There is also no particular restriction on the thickness of the second base layer as long as the thickness is larger than the height of the aimed antireflection structure. The aforementioned nanoimprint stamper and the second base layer are preferably made of silsesquioxane materials. After formed from the silsesquioxane materials, the structure is preferably subjected to heat treatment at a temperature of 400° C. to 1000° C. so as to obtain excellent strength.

Figure 8:
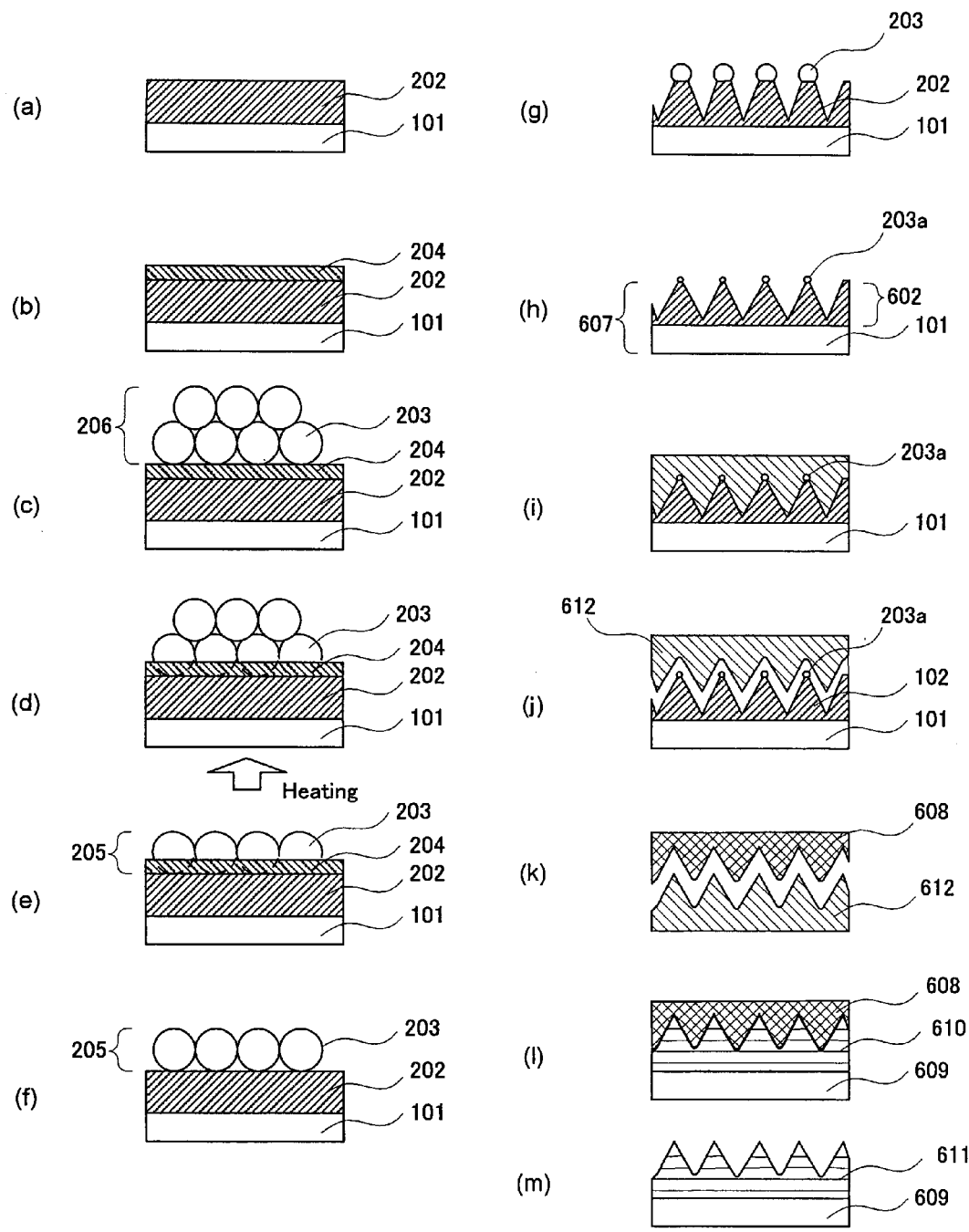
FIG. 8 shows sectional views schematically illustrating another method for forming an antireflection structure according to another embodiment of the present invention.

Furthermore, a replica which is produced by the above-mentioned method can be used to produce a antireflection structure. First, the replica 612 is produced by the method which is similar to the method producing the nanoimprint stamper (FIG. 8 (a) to (j)). Then, by use of the replica 612, a nanoimprint stamper 608 having a pattern reverse to the pattern formed on the replica is produced, for example, by an electrodeposition process (FIG. 8 (k)). Thereafter, by use of the nanoimprint stamper 608, a second base layer 610 formed on a second substrate 609 is subjected to nanoimprinting to produce a pattern 611 having almost the same structure as the replica 612 (FIG. 8 (l) to (m)). The structure 611 has a pattern reverse to the pattern formed on the master plate. Thus, a refractive index of the structure 611 varies smoothly, and gives high antireflection effect.

The antireflection structure of the present invention can be applied for forming displaying screens of various instruments such as cellular phones, for producing surfaces of LCD guide plates and for manufacturing illuminating surfaces of lighting devices. Accordingly, the present invention can be favorably used for producing, for example, cellular phones, displays, lighting devices, watches, PCs, and music players.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

EXAMPLES

The present invention is further explained below by the following examples, which by no means restrict the present invention.

Example 1

As a substrate, a 4-inch quartz substrate (synthesized quartz glass AQ [trademark], manufactured by Asahi Glass Co., Ltd.) was prepared. On the substrate, spin-on glass material (hereinafter, often referred to as "SOG material") (OCD-T7 [trademark], manufactured by Tokyo Ohka Kogyo Co., Ltd.), as a material for the base layer from which the antireflection structure was to be formed, was spin-coated at 2000 rpm for 40 seconds, and then baked on a hot-plate at 110° C. for 90 seconds. The substrate was annealed in a $N_2$ oven at 300° C. for 35 minutes. The thickness of the SOG membrane thus formed was observed by scanning electron microscope (hereinafter, often referred to as "SEM"), and found to be 450 nm. Further, a resist for half-micron pattern (THMR-ip3250 [trademark], manufactured by Tokyo Ohka Kogyo Co., Ltd.), as a material for the particle-trap layer, was spin-coated at 2000 rpm for 35 seconds, and then baked on a hot-plate at 110° C. for 90 seconds. The thickness of the particle-trap layer thus formed was observed and found to be 55 nm, which was suitable for catching only a mono-layer of particles having a mean particle size of 200 nm. Thereafter, the surface of the particle-trap layer was made hydrophilic by mean of parallel plate etching system (DEM-451 [trademark], manufactured by Canon ANELVA Corporation) under the conditions that: the etching gas was $O_2$, the flowing amount was 30 sccm, the pressure was 0.1 Torr, RF power was 100 W and the etching time was 5 seconds. Further, colloidal silica dispersed in water (PL-13 [trademark], manufactured by Fuso Chemical Co., Ltd.; mean size of silica particles: 200 nm; CV value: 10%; concentration of silica particles: 30 wt. %) was spin-coated at 1000 rpm for 60 seconds to form a multi-particle layer in which the particles were arranged in a few layers. The substrate was then baked on a hot-plate at 210° C. for 30 minutes, so that the particles only at the bottom of the multi-particle layer were attached onto the substrate. The obtained substrate was immersed in water and subjected to ultrasonic washing for 10 minutes, and then the water was drained out. After pure water for washing was newly introduced, ultrasonic washing was carried out again for 1 minute to remove excess particles, which were not attached on the substrate. The section of the obtained substrate was observed by SEM, and thereby it was confirmed that silica particles partly sunk in the trap layer were arranged in a mono-layer.

Successively, the particle-trap layer was removed by dry-etching under the conditions that: the etching gas was $O_2$, the flowing amount was 30 sccm, the pressure was 0.01 Torr, RF power was 100 W and the etching time was 1 minute. The section of the obtained substrate was observed by SEM, and thereby it was confirmed that the trap layer filling voids among the particles on the substrate was removed. The SOG base layer was further processed by dry-etching under the conditions that: the etching gas was $CF_4$, the flowing amount was 30 sccm, the pressure was 0.01 Torr, the electric power was 100 W and the etching time was 8 minutes. The obtained substrate was observed in detail by SEM. As a result, it was confirmed that the silica particles were slimed by etching and thereby that the SOG material was processed to form projections. It was also observed that the silica particles having served as an etching mask were left at the tips of the projections. The remaining particles had a relative volume of approx. 20% based on the volume of those before processed, and they were left on the tips of approx. 90% of all the projections. Because of the remaining particles, the obtained projections had round tips. The average interval among the projections and the average height of the projections were 210 nm and 350 nm, respectively. Further, the shape of the formed projection was measured to obtain the projection-shape function A(H) fitted into a quadratic function (5):

$$A(H) = -0.0126H^2 + 350 \qquad (5)$$

which indicated that the refractive index was moderately distributed.

The transmission and reflection spectra of the surface on which the antireflection structure was thus formed were measured. As a result, the transmittances at the wavelengths of 470 nm, 550 nm and 630 nm were found to be 99.5%, 99.7% and 99.7%, respectively. Accordingly, it was found that high transmittances were obtained in the whole visible region. On the other hand, the reflectances at the wavelengths of 470 nm, 550 nm and 630 nm were found to be 0.4%, 0.3% and 0.3%, respectively. Accordingly, it was found that the reflectances were largely reduced as compared with those (4.1%, 3.9% and 4.0%, respectively) before the antireflection structure was formed.

Example 2

As a substrate, a 6-inch Si substrate (manufactured by SUMCO Corporation) was prepared. The procedure of Example 1 was then repeated to form an antireflection structure comprising 350 nm-high SOG projections arranged at the interval of 210 nm on the 6-inch Si substrate. The obtained substrate was washed with water for 10 minutes, and dried on a hot-plate at 100° C. The silica particles on the tips of the projections were reacted with the SOG interface during the etching process, and thereby fixed so firmly that they did not come from the tips in washing.

The substrate after washed was then used as a master plate to form a nanoimprint stamper in the following manner. First, an electro-conductive membrane of Ni was formed on the substrate by a sputtering process. The sputtering process was carried out in a chamber which was beforehand evacuated to $8 \times 10^{-3}$ Pa and then into which argon gas was introduced until the inner pressure reached 1 Pa. While pure nickel metal was used as a target, DC power of 400 W was applied for 65 seconds to form an approx. 50 nm-thick Ni electro-conductive membrane. Thereafter, the master plate on which the electro-conductive membrane was thus formed was then immersed in a plating solution of nickel sulfamate (NS-160 [trademark], manufactured by Showa Chemical Industry CO., LTD.), and subjected to a Ni electrodeposition process for 90 minutes to form an approx. 300 μm-thick electrodeposition membrane. The conditions of electrodeposition bath were as follows:
Nickel sulfamate: 600 g/L,
Boric acid: 40 g/L,
Surface active agent (sodium lauryl sulfate): 0.15 g/L,
pH: 4.0, and
Current density: 20 A/dm$^2$.

The electrodeposition membrane and the electro-conductive membrane were peeled from the master plate, to obtain a nanoimprint stamper. The SOG on the master plate was partly attached on the surface of the obtained stamper, and hence the surface was cleaned to remove the residue by etching treatment under the conditions that: the etching gas was $CF_4$, the flowing amount was 30 sccm, the pressure was 0.06 Torr and RF power was 100 W. The surface of the stamper was observed by SEM, and it was confirmed that a hole pattern reverse to the projection pattern on the master plate was formed on the whole surface of the stamper. Thereafter, burrs of the stamper were removed by punching with an edged metal punch to obtain a desirably shaped nanoimprint stamper.

The obtained nanoimprint stamper was treated with a releasing agent for nanoimprint (Durasurf HD-1100 [trademark], available from Daikin Chemicals Sales Co., Ltd.). The releasing agent was spin-coated on the stamper at 3000 rpm for 20 seconds, and then baked on a hot-plate at 60° C. for 1 hour.

Successively, a nanoimprinting process was performed by use of the obtained stamper. First, a glass substrate of 100 mm×100 mm was prepared. Then, polymethyl methacrylate (PMMA, Mw: 20000) was dissolved in polyethylene glycol monomethyl ether acetate (PGMEA) in 30 wt. %, and the obtained solution was spin-coated on the substrate at 2000 rpm for 40 seconds to form a 2.5 μm-thick PMMA membrane. The membrane was subjected to thermal imprint using the Ni stamper. While the substrate was heated at 150° C., the stamper was imprinted under 0.5 MPa for 2 minutes. After the substrate was cooled to room temperature, the stamper was released. The structure thus formed on the PMMA surface was observed by SEM, and it was found that the formed antireflection structure had almost the same pattern as the master plate had.

The transmission and reflection spectra of the surface on which the antireflection structure was thus formed were measured. As a result, the transmittances at the wavelengths of 470 nm, 550 nm and 630 nm were found to be 99.5%, 99.7% and 99.7%, respectively. Accordingly, it was found that high transmittances were obtained in the whole visible region. On the other hand, the reflectances at the wavelengths of 470 nm, 550 nm and 630 nm were found to be 0.4%, 0.3% and 0.3%, respectively. Accordingly, it was found that the reflectances were largely reduced as compared with those (4.1%, 3.9% and 4.0%, respectively) before the antireflection structure was formed.

Example 3

As a substrate, a 6-inch Si substrate (manufactured by SUMCO Corporation) was prepared. After a resist for half-micron pattern (THMR-ip3250 [trademark], manufactured by Tokyo Ohka Kogyo Co., Ltd.) was diluted with ethyl lactate to 30%, the obtained solution was spin-coated on the Si substrate at 2000 rpm for 40 seconds and then baked on a hot-plate at 110° C. for 90 seconds. The substrate was further annealed in a $N_2$ oven at 250° C. for 1 hour to harden the resist and thereby to form a resist layer (base layer). The thickness of the resist layer was measured with a stylus profilometer (Tallystep [trademark], manufactured by Taylor Hobson K.K.) and found to be 400 nm. Successively, a 55 nm-thick PMMA membrane was formed thereon as the particle-trap layer. The surface of the particle-trap layer was then made hydrophilic by mean of parallel plate etching system (DEM-451 [trademark], manufactured by Canon ANELVA Corporation) under the conditions that: the etching gas was $O_2$, the flowing amount was 30 sccm, the pressure was 0.1 Torr, RF power was 100 W and the etching time was 5 seconds. Further, heat-resistant polystyrene particles dispersed in water (manufactured by JSR Corporation; mean particle size: 200 nm; CV value: 5%; concentration of particles: 30 wt. %) was spin-coated at 1000 rpm for 60 seconds to form a multi-particle layer in which the particles were arranged in a few layers. The Si substrate was then baked on a hot-plate at 130° C. for 5 minutes, so that the particles only at the bottom of the multi-particle layer were attached onto the substrate. The obtained substrate was immersed in water and subjected to ultrasonic washing for 10 minutes, and then the water was drained out. After pure water for washing was newly introduced, ultrasonic washing was carried out again for 1 minute to remove excess particles, which were not attached on the substrate. The section of the obtained substrate was observed by SEM, and thereby it was confirmed that polystyrene particles partly sunk in the trap layer were arranged in a monolayer.

Successively, the particle-trap layer was removed by dry-etching under the conditions that: the etching gas was $O_2$, the flowing amount was 30 sccm, the pressure was 0.01 Torr, the electric power was 100 W and the etching time was 25 seconds. The section of the obtained substrate was observed by SEM, and thereby it was confirmed that the PMMA filling voids among the particles on the substrate was removed. The resist layer was further processed by dry-etching under the conditions that: the etching gas was $O_2$, the flowing amount was 30 sccm, the pressure was 0.01 Torr, RF power was 100 W and the etching time was 2.5 minutes. The obtained substrate was observed in detail by SEM. As a result, it was confirmed that the polystyrene particles were slimed by etching and thereby that the resist layer was processed to form projections. It was also observed that the polystyrene particles having served as an etching mask were left at the tips of the projections. The remaining particles had a relative volume of approx. 15% based on the volume of those before processed, and they were left on the tips of approx. 95% of all the projections. Because of the remaining particles, the obtained projections had round tips. The average interval among the projections, the average height of the projections and the aspect ratio of the projections were 200 nm, 380 nm and 1.9, respectively.

The substrate thus obtained was then used as a master plate to form a nanoimprint stamper by a Ni electrodeposition process, and a PMMA membrane was subjected to a nanoimprining process by use of the nanoimprint stamper. The Ni electrodeposition process and the nanoimprining process were carried out in the same manner as in Example 2. The structure formed on the PMMA surface was observed by SEM, and it was confirmed that the formed antireflection structure had almost the same pattern as the master plate had.

The transmission and reflection spectra of the surface on which the antireflection structure was thus formed were measured. As a result, the transmittances at the wavelengths of 470 nm, 550 nm and 630 nm were found to be 99.6%, 99.7% and 99.6%, respectively. Accordingly, it was found that high transmittances were obtained in the whole visible region. On the other hand, the reflectances at the wavelengths of 470 nm, 550 nm and 630 nm were found to be 0.2%, 0.3% and 0.3%, respectively. Accordingly, it was found that the reflectances were largely reduced as compared with those (4.1%, 3.9% and 4.0%, respectively) before the antireflection structure was formed.

Example 4

As a substrate, a 4-inch quartz substrate (synthesized quartz glass AQ [trademark], manufactured by Asahi Glass Co., Ltd.) was prepared. On the substrate, SOG material (OCD-T12 [trademark], manufactured by Tokyo Ohka Kogyo Co., Ltd.), as a material for the base layer from which the antireflection structure was to be formed, was spin-coated at 2000 rpm for 40 seconds, and then baked on a hot-plate at 110° C. for 90 seconds. The substrate was annealed in a $N_2$ oven at 300° C. for 35 minutes. The thickness of the SOG membrane thus formed was observed by SEM, and found to be 480 nm. Further, a resist for half-micron pattern (THMR-ip3250 [trademark], manufactured by Tokyo Ohka Kogyo Co., Ltd.), as a material for the particle-trap layer, was spin-coated at 2000 rpm for 35 seconds, and then baked on a hot-plate at 110° C. for 90 seconds. The thickness of the particle-trap layer thus formed was observed and found to be 55 nm, which was suitable for catching only a mono-layer of particles having a mean particle size of 200 nm. Thereafter, the surface of the particle-trap layer was made hydrophilic by mean of parallel plate etching system (DEM-451 [trademark], manufactured by Canon ANELVA Corporation) under the conditions that: the etching gas was $O_2$, the flowing amount was 30 sccm, the pressure was 0.1 Torr, RF power was 100 W and the etching time was 5 seconds. Further, colloidal silica dispersed in water (PL-13 [trademark], manufactured by Fuso Chemical Co., Ltd.; mean size of silica particles: 200 nm; CV value: 10%; concentration of silica particles: 30 wt. %) was spin-coated at 1000 rpm for 60 seconds to form a multi-particle layer in which the particles were arranged in a few layers. The substrate was then baked on a hot-plate at 210° C. for 30 minutes, so that the particles only at the bottom of the multi-particle layer were attached onto the substrate. The obtained substrate was immersed in water and subjected to ultrasonic washing for 10 minutes, and then the water was drained out. After pure water for washing was newly introduced, ultrasonic washing was carried out again for 1 minute to remove excess particles, which were not attached on the substrate. The section of the obtained substrate was observed by SEM, and thereby it was confirmed that silica particles partly sunk in the trap layer were arranged in a mono-layer.

Successively, the particle-trap layer was removed by dry-etching under the conditions that: the etching gas was $O_2$, the flowing amount was 30 sccm, the pressure was 0.01 Torr, RF power was 100 W and the etching time was 1 minute. The section of the obtained substrate was observed by SEM, and thereby it was confirmed that the trap layer filling voids among the particles on the substrate was removed. The SOG base layer was further processed by dry-etching under the conditions that: the etching gas was $CF_4$ gas, the flowing amount was 30 sccm, the pressure was 0.01 Torr, RF power was 100 W and the etching time was 9 minutes. The obtained substrate was observed in detail by SEM. As a result, it was confirmed that the silica particles were slimed by etching and thereby that the SOG base layer was processed to form projections. It was also observed that the silica particles having served as an etching mask were left at the tips of the projections. The remaining particles had a relative volume of approx. 15% based on the volume of those before processed, and they were left on the tips of approx. 85% of all the projections. Because of the remaining particles, the obtained projections had round tips. The average interval among the projections, the average height of the projections and the aspect ratio of the projections were 210 nm, 310 nm and 1.7, respectively. The obtained substrate was annealed in air at 800° C. for 30 minutes to convert SOG into $SiO_x$, and thereby the mechanical strength was enhanced. Since the SOG material had a small thermal shrinkage ratio, the pattern shape was scarcely changed after the anneal treatment.

Thereafter, a releasing agent for nanoimprint (Durasurf HD-1100 [trademark], available from Daikin Chemicals Sales Co., Ltd.) was spin-coated on the substrate at 3000 rpm for 20 seconds, and then baked on a hot-plate at 60° C. for 1 hour. The thus-treated substrate provided with the antireflection structure was used as a nanoimprint stamper in the following nanoimprinting process at room temperature. First, SOG material (OCD-T12 [trademark], manufactured by Tokyo Ohka Kogyo Co., Ltd.) was spin-coated on a 4-inch quartz substrate (synthesized quartz glass AQ [trademark], manufactured by Asahi Glass Co., Ltd.) at 2000 rpm for 40 seconds, and baked on a hot-plate at 110° C. for 90 seconds to evaporate the solvent and thereby to form a SOG membrane. The stamper was nanoimprinted onto the SOG membrane under 2.5 MPa for 1 minute at the substrate temperature of 25° C., and then released. The pattern thus formed on the surface by imprinting was reverse to that of the antireflection structure formed by etching. The obtained substrate was annealed in air at 800° C. for 30 minutes to convert SOG into $SiO_x$, and thereby the mechanical strength was enhanced. Since having a small thermal shrinkage ratio, the pattern obtained by imprinting the master plate onto the SOG membrane on the quartz substrate did not suffer pattern collapse even after the anneal treatment. The quartz substrate thus provided with the reverse pattern was then treated with a releasing agent, and was used as a nanoimprint stamper in the following nanoimprinting process. First, a glass substrate of 100 mm×100 mm was prepared. Then, polymethyl methacrylate (PMMA, Mw: 20000) was dissolved in PGMEA in 30 wt. %, and the obtained solution was spin-coated on the substrate at 2000 rpm for 40 seconds to form a 2.5 μm-thick PMMA membrane. The membrane was thermally imprinted with the above stamper under 0.5 MPa for 2 minutes at the substrate temperature of 150° C. After the substrate was cooled to room temperature, the stamper was released. The structure thus formed on the PMMA surface was observed by SEM, and it was confirmed that the formed antireflection structure had almost the same pattern as the master plate had.

The transmission and reflection spectra of the surface on which the antireflection structure was thus formed were measured. As a result, the transmittances at the wavelengths of 470 nm, 550 nm and 630 nm were found to be 99.3%, 99.5% and 99.5%, respectively. Accordingly, it was found that high transmittances were obtained in the whole visible region. On the other hand, the reflectances at the wavelengths of 470 nm, 550 nm and 630 nm were found to be 0.6%, 0.4% and 0.4%, respectively. Accordingly, it was found that the reflectances were largely reduced as compared with those (4.1%, 3.9% and 4.0%, respectively) before the antireflection structure was formed.

Comparative Example 1

The procedure of Example 1 was repeated to obtain a substrate provided with a mono-particle layer formed on a SOG base layer. The SOG base layer was processed by etching under the conditions that: the etching gas was $CF_4$, the flowing amount was 30 sccm, the pressure was 0.01 Torr, RF power was 100 W and the etching time was 12 minutes. The etching process was continued until all the silica particles serving as an etching mask completely disappeared. The obtained substrate was observed in detail by SEM. As a result, it was confirmed that the silica particles were slimed by etching and thereby that a pattern of projections was formed in the same manner as in Example 1. However, it was also observed that 30% of the projections had tips sharpened by overetching. The average interval among the projections, the average height of the projections and the aspect ratio of the projections were 210 nm, 340 nm and 1.7, respectively.

The transmission and reflection spectra of the surface on which the antireflection structure was thus formed were measured. As a result, the transmittances at the wavelengths of 470 nm, 550 nm and 630 nm were found to be 99.1%, 98.9% and 99.0%, respectively. Accordingly, it was found that high transmittances were obtained in the whole visible region. On the other hand, the reflectances at the wavelengths of 470 nm, 550 nm and 630 nm were found to be 0.9%, 1.0% and 1.0%, respectively.

The antireflection structure of the present invention can be applied for forming displaying surfaces of various instruments such as cellular phones, for producing surfaces of LCD guide plates and for manufacturing illuminating surface of lighting devices. Accordingly, the present invention can be favorably used for producing, for example, cellular phones, displays, lighting devices, watches, PCs, and music players.

The invention claimed is:

1. An antireflection structure in which plural projections are arranged on a substrate, formed by a method comprising:
    forming a base layer on a substrate,
    forming a particle-trap layer on said base layer,
    forming, on said particle-trap layer, a multi-particle layer in which particles having a mean particle size of 20 to 1000 nm are arranged in one or more layers,
    sinking the particles positioned at the bottom of said multi-particle layer into the particle-trap layer,
    removing the particles in said multi-particle layer except the particles positioned at the bottom,
    removing said particle-trap layer with holding the particles positioned at the bottom on the base layer, and
    performing an etching process in which said base layer is subjected to reactive ion etching while the particles remaining on said base layer are used as a mask to form projections, under the conditions that the etching rate ratio of said base layer to said particles is more than 1 but not more than 5 and that the process is stopped before the particles disappear by etching,
    wherein 80% or more of the particles remaining after the etching process have a relative volume of more than 0% but not more than 25% based on the volume of those before the etching process, and wherein the projections comprise the particles having a mean particle size on the tips of the projections.

2. The antireflection structure according to claim 1, comprising said substrate and said plurality of projections, wherein the projections have round tips.

3. The antireflection structure according to claim 1, wherein said particles are made of silica materials and said base layer is made of at least one material selected from the group consisting of silica materials, silicone materials and silsesquioxane materials.

4. The antireflection structure according to claim 1, wherein said base layer and said particles are made of silsesquioxane materials and silica materials, respectively, and the antireflection structure after formed is further subjected to heat treatment at a temperature of 400° C. to 1000° C.

5. The antireflection structure according to claim 1, wherein said particles are made of polystyrene resin and said base layer is made of at least one material selected from the group consisting of acrylic resin, phenol resin, polystyrene resin and polyimide resin.

6. The antireflection structure according to claim 1, wherein said particles have a CV value of 15% or less.

7. The antireflection structure according to claim 1, wherein the plural projections are substantially conical projections.

8. An antireflection structure in which plural projections are arranged, formed by a method comprising:
    forming a base layer on a substrate,
    forming a particle-trap layer on said base layer,
    forming, on said particle-trap layer, a multi-particle layer in which particles having a mean particle size of 20 to 1000 nm are arranged in one or more layers,
    sinking the particles positioned at the bottom of said multi-particle layer into the particle-trap layer,
    removing the particles in said multi-particle layer except the particles positioned at the bottom,
    removing said particle-trap layer with holding the particles positioned at the bottom on the base layer,
    performing an etching process in which said base layer is subjected to reactive ion etching while the particles remaining on said base layer are used as a mask to form projections, under the conditions that the etching rate ratio of said base layer to said particles is more than 1 but not more than 5 and that the process is stopped before the particles disappear by etching, so as to produce a master plate in which the plural projections are arranged on the substrate,
    using said master plate to produce a nanoimprint stamper having a pattern reverse to the pattern formed on the master plate, and
    performing a nanoimprinting process in which said nanoimprint stamper is used to produce a replica of the pattern on the master plate,
    wherein 80% or more of the particles remaining after the etching process have a relative volume of more than 0% but not more than 25% based on the volume of those before the etching process, and wherein the projections comprise the particles having a mean particle size on the tips of the projections.

9. The antireflection structure according to claim 8, wherein said particles are made of silica materials and said base layer is made of at least one material selected from the group consisting of silica materials, silicone materials and silsesquioxane materials.

10. The antireflection structure according to claim 8, wherein said base layer and said particles are made of silsesquioxane materials and silica materials, respectively, and the antireflection structure after formed is further subjected to heat treatment at a temperature of 400° C. to 1000° C.

11. The antireflection structure according to claim 8, wherein said particles are made of polystyrene resin and said base layer is made of at least one material selected from the group consisting of acrylic resin, phenol resin, polystyrene resin and polyimide resin.

12. The antireflection structure according to claim 8, wherein said particles have a CV value of 15% or less.

13. The antireflection structure according to claim 8, wherein the plural projections are substantially conical projections.

14. A nanoimprint stamper for forming an antireflection structure, produced by the steps of:
forming a base layer on a substrate,
forming a particle-trap layer on said base layer,
forming, on said particle-trap layer, a multi-particle layer in which particles having a mean particle size of 20 to 1000 nm are arranged in one or more layers,
sinking the particles positioned at the bottom of said multi-particle layer into the particle-trap layer,
removing the particles in said multi-particle layer except the particles positioned at the bottom,
removing said particle-trap layer with holding the particles positioned at the bottom on the base layer,
performing an etching process in which said base layer is subjected to reactive ion etching while the particles remaining on said base layer are used as a mask to form projections, under the conditions that the etching rate ratio of said base layer to said particles is more than 1 but not more than 5 and that the process is stopped before the particles disappear by etching, so as to produce a master plate in which the plural projections are arranged on the substrate, and
using said master plate to produce a nanoimprint stamper having a pattern reverse to the pattern formed on the master plate,
wherein 80% or more of the particles remaining after the etching process have a relative volume of more than 0% but not more than 25% based on the volume of those before the etching process, and wherein the projections comprise the particles having a mean particle size on the tips of the projections.

15. The antireflection structure according to claim 14, wherein said particles are made of silica materials and said base layer is made of at least one material selected from the group consisting of silica materials, silicone materials and silsesquioxane materials.

16. The antireflection structure according to claim 14, wherein said base layer and said particles are made of silsesquioxane materials and silica materials, respectively, and the antireflection structure after formed is further subjected to heat treatment at a temperature of 400° C. to 1000° C.

17. The antireflection structure according to claim 14, wherein said particles are made of polystyrene resin and said base layer is made of at least one material selected from the group consisting of acrylic resin, phenol resin, polystyrene resin and polyimide resin.

18. The antireflection structure according to claim 14, wherein said particles have a CV value of 15% or less.

19. The antireflection structure according to claim 14, wherein the plural projections are substantially conical projections.

20. A nanoimprint stamper for forming an antireflection structure, produced by the steps of:
forming a base layer on a substrate,
forming a particle-trap layer on said base layer,
forming, on said particle-trap layer, a multi-particle layer in which particles having a mean particle size of 20 to 1000 nm are arranged in one or more layers,
sinking the particles positioned at the bottom of said multi-particle layer into the particle-trap layer,
removing the particles in said multi-particle layer except the particles positioned at the bottom,
removing said particle-trap layer with holding the particles positioned at the bottom on the base layer,
performing an etching process in which said base layer is subjected to reactive ion etching while the particles remaining on said base layer are used as a mask to form projections, under the conditions that the etching rate ratio of said base layer to said particles is more than 1 but not more than 5 and that the process is stopped before the particles disappear by etching, so as to produce a master plate in which the plural projections are arranged on the substrate,
using said master plate to produce a replica having a pattern reverse to the pattern formed on the master plate, and
using said replica to produce a nanoimprint stamper having a pattern reverse to the pattern formed on the replica,
wherein 80% or more of the particles remaining after the etching process have a relative volume of more than 0% but not more than 25% based on the volume of those before the etching process, and wherein the projections comprise the particles having a mean particle size on the tips of the projections.

21. The antireflection structure according to claim 20, wherein said particles are made of silica materials and said base layer is made of at least one material selected from the group consisting of silica materials, silicone materials and silsesquioxane materials.

22. The antireflection structure according to claim 20, wherein said base layer and said particles are made of silsesquioxane materials and silica materials, respectively, and the antireflection structure after formed is further subjected to heat treatment at a temperature of 400° C. to 1000° C.

23. The antireflection structure according to claim 20, wherein said particles are made of polystyrene resin and said base layer is made of at least one material selected from the group consisting of acrylic resin, phenol resin, polystyrene resin and polyimide resin.

24. The antireflection structure according to claim 20, wherein said particles have a CV value of 15% or less.

25. The antireflection structure according to claim 20, wherein the plural projections are substantially conical projections.

* * * * *